(12) United States Patent
Nakamura et al.

(10) Patent No.: US 7,692,923 B2
(45) Date of Patent: Apr. 6, 2010

(54) POWER CONVERTER

(75) Inventors: Takayoshi Nakamura, Hitachi (JP);
Kinya Nakatsu, Hitachinaka (JP);
Hideki Miyazaki, Hitachi (JP); Ryuichi Saito, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 24 days.

(21) Appl. No.: 12/019,142

(22) Filed: Jan. 24, 2008

(65) Prior Publication Data
US 2008/0198548 A1 Aug. 21, 2008

(30) Foreign Application Priority Data
Feb. 19, 2007 (JP) .............................. 2007-037318

(51) Int. Cl.
*H05K 7/20* (2006.01)

(52) U.S. Cl. ................ 361/699; 361/689; 361/704; 361/707; 361/715; 165/80.4; 165/104.33; 363/141

(58) Field of Classification Search ........................ None
See application file for complete search history.

(56) References Cited

U.S. PATENT DOCUMENTS

| | | | | |
|---|---|---|---|---|
| 6,166,937 | A * | 12/2000 | Yamamura et al. | ........... 363/141 |
| 6,310,775 | B1 * | 10/2001 | Nagatomo et al. | ........... 361/707 |
| 6,978,856 | B2 * | 12/2005 | Nakamura et al. | ......... 180/68.4 |
| 6,992,887 | B2 * | 1/2006 | Jairazbhoy et al. | ........... 361/689 |
| 7,031,161 | B2 * | 4/2006 | Miettinen et al. | ........... 361/704 |
| 7,090,044 | B2 * | 8/2006 | Nakamura et al. | ......... 180/65.8 |
| 7,190,581 | B1 * | 3/2007 | Hassani et al. | ............... 361/699 |
| 7,301,755 | B2 * | 11/2007 | Rodriguez et al. | .......... 361/676 |
| 2008/0049476 | A1 * | 2/2008 | Azuma et al. | ............... 363/131 |

FOREIGN PATENT DOCUMENTS

| | | |
|---|---|---|
| JP | 6-189543 A | 7/1994 |
| JP | 9-215343 A | 8/1997 |
| JP | 2002-270748 A | 9/2002 |
| JP | 2002-343409 A | 11/2002 |
| JP | 2003-134823 A | 5/2003 |
| JP | 2004-296958 A | 10/2004 |
| JP | 2005-12940 A | 1/2005 |
| JP | 2005-137116 A | 5/2005 |
| JP | 2006-49555 A | 2/2006 |
| JP | 2006-74963 A | 3/2006 |
| JP | 2006-190911 A | 7/2006 |
| JP | 2006-207920 A | 8/2006 |
| JP | 2006-262623 A | 9/2006 |
| JP | 2007-28785 A | 2/2007 |

OTHER PUBLICATIONS

Japanese Office Action dated Dec. 9, 2008 with partial translation (Five (5) pages).

* cited by examiner

*Primary Examiner*—Boris L Chervinsky
(74) *Attorney, Agent, or Firm*—Crowell & Moring LLP

(57) ABSTRACT

A power converter of the present invention includes at least two power semiconductor modules having a plurality of switching devices, at least two cooling jackets having a coolant path for cooling the plurality of power semiconductor modules and equipped with the power semiconductor modules, a capacitor module interposed between the at least two cooling jackets, and a connector provided in the at least two cooling jackets for connecting the coolant path.

8 Claims, 8 Drawing Sheets

POWER CONVERTER

CLAIM OF PRIORITY

The present application claims priority from Japanese application serial No. 2007-037318, filed on Feb. 19, 2007, the content of which is hereby incorporated by reference into this application.

FIELD OF THE INVENTION

The present invention relates to a power converter that converts input power to predetermined power and then outputs the power, and more particularly, to a power converter used in a hybrid electric vehicle (HEV) to drive a motor.

BACKGROUND OF THE INVENTION

A power converter has been conventionally used for driving a motor in a hybrid electric vehicle (HEV) and the like. The power converter includes power semiconductors that cause a large current to flow and thus generates much heat. Therefore, efficient cooling of the power converter is crucial.

Japanese Patent Laid-open No. 2002-270748 discloses a semiconductor module in which conductive parts each having a cooling path therein are connected to a base plate via a resin insulation layer and in which power semiconductor devices are solder-bonded to the conductive parts serving as conductors of a circuit pattern. Another power converter is also disclosed that is configured to connect the cooling path of each conductive part with an insulation pipe, thereby allowing a coolant to flow through the insulation pipe.

SUMMARY OF THE INVENTION

However, in the power converter disclosed in the Japanese Patent Laid-open No. 2002-270748, the conductive parts are provided on the base plate, and each power semiconductor device is arranged on each conductive part. With such a configuration, therefore, miniaturization of the power converter cannot be achieved. In particular, no refinement is made to improve the productivity. Moreover, the flexibility is low in cooling the electronic parts such as a control board and a capacitor.

In view of the foregoing, an object of the present invention is to achieve miniaturization of the power converter while improving the productivity of the power converter as well as the flexibility in cooling the electronic parts.

In order to solve the problems, an exemplary example of the power converter of the present invention is provided with a first power semiconductor module including a first switching device, a second power semiconductor module including a second switching device, a first cooling jacket including a first cooling path where a coolant for cooling the first power semiconductor module flows and including the first power semiconductor module mounted thereon, a second cooling jacket including a second cooling path where a coolant for cooling the second power semiconductor module flows and including the second power semiconductor module mounted thereon, an electronic part placed between the first cooling jacket and the second cooling jacket, and a connector for connecting the first cooling path of the first cooling jacket and the second cooling path of the second cooling jacket.

According to the present invention, a power converter with improved productivity can be provided. Miniaturization of the power converter can also be achieved. In addition, flexibility in cooling the electronic parts can be improved.

DESCRIPTION OF THE PREFERRED EMBODIMENTS

Embodiments of the present invention will now be described in detail with reference to the accompanying drawings.

(Hybrid Electric Vehicle)

Figure 1:
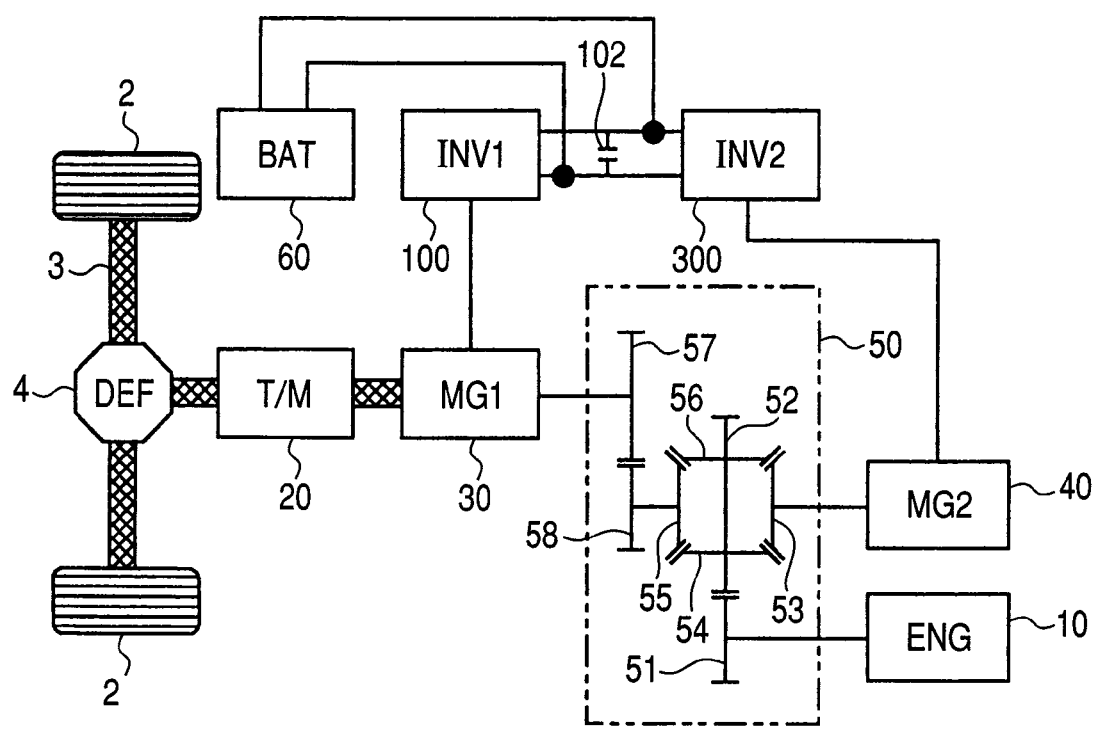
FIG. 1 is a schematic diagram of an exemplary hybrid electric vehicle (HEV) using a power converter of the present invention.
Figure 2:
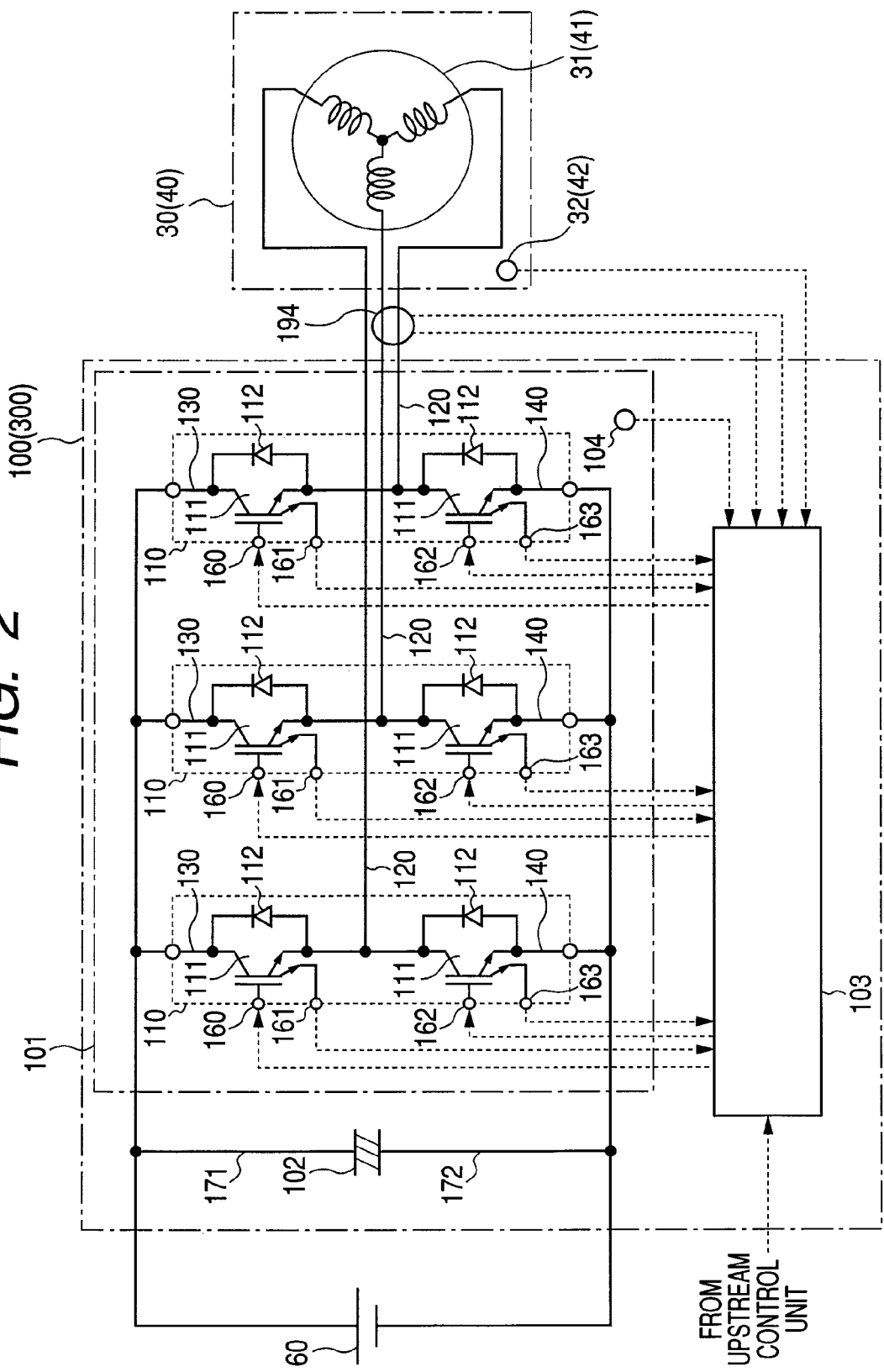
FIG. 2 is an exemplary schematic circuit diagram of the power converter of the present invention.

FIG. 1 illustrates the configuration of an exemplary hybrid electric vehicle 1. FIG. 2 illustrates the circuit configuration of power converters 100 and 300.

The hybrid electric vehicle (hereinafter, "HEV") 1 of this embodiment is a single electric vehicle and includes two vehicle driving systems. One of the systems is an engine system having an internal combustion engine 10 as a power source. The engine system is primarily used as a driving source of the HEV. Another one of the systems is an automotive electric system having motor generators 30 and 40 as a power source. The automotive electric system is primarily used as a driving source of the HEV and a power generation source of the HEV.

A front-wheel axle 3 is rotatably supported at the front section of the vehicle body (not shown). A pair of front wheels 2 are arranged at the ends of the front-wheel axle 3. At the rear section of the vehicle body, a rear-wheel axle (not shown) is rotatably supported. A pair of rear wheels (not shown) are arranged at the ends of the rear-wheel axle. The HEV of this embodiment employs a so-called front-wheel drive system in which driving wheels driven by power serve as the front wheels 2 and following wheels being dragged serve as the rear wheels. However, the opposite of the system, i.e. rear-wheel drive system, may also be employed.

At the center of the front-wheel axle 3, a front differential gear (hereinafter, "front DEF") 4 is provided. The front-wheel axle 3 is mechanically connected to the output side of the front DEF 4. The output shaft of a transmission 20 is mechanically connected to the input side of the front DEF 4. The front DEF 4 is a differential power-distribution system that distributes, to the front-wheel axle 3 (to the left and right), a rotational driving force shifted and transferred by the transmission 20. The output side of the motor generator 30 is mechanically connected to the input side of the transmission 20. The output side of the engine 10 and the output side of the motor generator 40 are mechanically connected to the input side of the motor generator 30 through a power-distribution system 50.

The motor generators 30, 40, and the power-distribution system 50 are housed within the case of the transmission 20.

The power-distribution system 50 is a differential system comprising cogwheels 51 to 58. The cogwheels 53 to 56 are bevel gears. The cogwheels 51, 52, 57, and 58 are spur gears. The force of the motor generator 30 is directly transferred to the transmission 20. The shaft of the motor generator 30 is coaxial with the cogwheel 57. With this configuration, when no driving power is supplied to the motor generator 30, the force transferred to the cogwheel 57 is transferred to the input side of the transmission 20 intact. When the cogwheel 51 is driven by activation of the engine 10, the force of the engine 10 is sequentially transferred from the cogwheel 51 to the cogwheel 52, from the cogwheel 52 to the cogwheels 54 and 56, then from the cogwheels 54 and 56 to the cogwheel 58, and ultimately to the cogwheel 57. When the cogwheel 53 is driven by activation of the motor generator 40, rotations of the motor generator 40 are sequentially transferred from the cogwheel 53 to the cogwheels 54 and 56, then from the cogwheels 54 and 56 to the cogwheel 58, and ultimately to the cogwheel 57.

Instead of the differential system, other systems such as a planetary gear system may be utilized as a power-distribution system 50.

The motor generators 30 and 40 are synchronous motors including rotors and permanent magnets, and the AC power supplied to armature windings 31 and 41 of the stators is controlled by the power converters 100 and 300, thereby controlling the drive of the motor generators 30 and 40. A battery 60 is electrically connected to the power converters 100 and 300, allowing mutual transfer of the power between the battery 60 and the power converters 100 and 300.

In this embodiment, two motor-generator units are provided; a first motor-generator unit includes the motor generator 30 and the power converter 100, while a second motor-generator unit includes the motor generator 40 and the power converter 300. These units are properly used depending on the state of operation. More specifically, with the vehicle being driven by the power from the engine 10, if the torque of the vehicle is to be assisted, the second motor-generator unit serving as the generator unit is activated by the power of the engine 10 to generate power, and the generated power activates the first motor-generator unit serving as the generator unit. In a similar case, if the speed of the vehicle is to be assisted, the first motor-generator unit serving as the generator unit is activated by the power of the engine 10 to generate power, and the generated power activates the second motor-generator unit serving as the generator unit.

In this embodiment, activation of the first motor-generator unit, serving as the generator unit, with the power of the battery 60 enables vehicle driving using the power of the motor generator 30 alone.

In this embodiment, the battery 60 can be charged by activating the first motor-generator unit or the second motor-generator unit, serving as the generator unit, using the power of the engine 10 or power from the wheels to generate power.

(Circuit Configuration of the Power Converter)

The circuit configuration of the power converters 100 and 300 will now be described with reference to FIG. 2.

In this embodiment, an example will be described where the power converters 100 and 300 are configured separately. However, the power converters 100 and 300 may be integrated to form a single inverter unit.

In this embodiment, to easily distinguish between power lines and signal lines, the power lines are illustrated with solid lines and the signal lines are illustrated with dotted lines.

The power converter 100, 300 includes a power semiconductor module 101, a capacitor module 102, and a control unit 103.

The power semiconductor module 101 constitutes the main circuit and includes a plurality of switching power semiconductor devices. The plurality of switching power semiconductor devices operate by receiving a drive signal outputted from the control unit 103 and convert the DC power supplied from the battery 60 to three-phase AC power.

The converted power is supplied to the armature windings 31 and 41 of the motor generators 30 and 40. The main circuit is configured with a three-phase bridge circuit, and series circuits of three phases are electrically connected in parallel between positive and negative electrodes of the battery 60. The series circuit is also called an arm and comprises upper-arm switching power semiconductor devices and lower-arm switching power semiconductor devices.

In this embodiment, IGBTs (insulated gate bipolar transistor) 111 are provided as switching power semiconductor devices. The IGBT 111 includes three electrodes; a collector electrode, an emitter electrode, and a gate electrode. Between the collector electrode and the emitter electrode of the IGBT 111, a diode 112 is electrically connected. The diode 112 includes two electrodes: a cathode electrode and an anode electrode. The cathode electrode is electrically connected to the collector electrode of the IGBT 111 and the anode electrode is electrically connected to the emitter electrode of the IGBT 111 so that the direction from the emitter electrode to the collector electrode of the IGBT 111 becomes a forward direction.

Instead of the IGBT 111, a MOSFET (metal-oxide semiconductor field effect transistor) may be used as a power semiconductor device for switching. The MOSFET includes three electrodes; a drain electrode, a source electrode, and a gate electrode.

Between the source electrode and the drain electrode, the MOSFET is provided with a parasitic diode in which the direction from the drain electrode to the source electrode is forward. For this reason, unlike the IGBT, installation of the external diode 112 is not required.

The arms of three phases are provided corresponding to each of the phase windings of the armature windings 31 and 41 of the motor generators 30 and 40 (six arms total). In each of the three phases, the emitter electrode of the upper-arm IGBT 111 and the collector electrode of the lower-arm IGBT 111 are electrically connected in series through a middle electrode 120. The collector electrode of the upper-arm IGBT 111 of each phase is electrically connected to a positive capacitor electrode 171 of the capacitor module 102 through a positive electrode 130. The emitter electrode of the lower-arm IGBT 111 of each phase is electrically connected to a negative capacitor electrode 172 of the capacitor module 102 through a negative electrode 140.

The middle electrode 120 at the middle point (joint of the emitter electrode of the upper-arm IGBT 111 and the collector electrode of the lower-arm IGBT 111) of each arm is electrically connected to the corresponding phase winding of the armature windings 31 and 41 of the motor generators 30 and 40. In this embodiment, one phase (two arms) is constituted by one circuit unit (semiconductor apparatus) 110, which will be described in detail later.

The capacitor module 102 is provided for smoothing the fluctuation of the DC voltage caused by the switching operation of the IGBT 111. The positive electrode of the battery 60 is electrically connected to the positive capacitor electrode 171 of the capacitor module 102. The negative electrode of the battery 60 is electrically connected to the negative capacitor electrode 172 of the capacitor module 102. Thus, between the DC terminal (input) of the power semiconductor module 101 and the battery 60, the capacitor module 102 is electrically connected in parallel to the DC terminal (between the positive electrode 130 and negative electrode 140 of each of the three phases) of the power semiconductor module 101 and to the battery 60.

The control unit 103 is provided for activating the IGBT 111 and includes a control circuit for generating a timing signal to control the switch timing of the IGBT 111 based on input information from other control circuit, sensor, and so on, and a drive circuit for generating a drive signal to cause the IGBT 111 to perform switching operation based on the timing signal outputted from the control circuit.

The control circuit is constituted by a microcomputer. The microcomputer is provided with input information including a target torque required for the motor generators 30 and 40, a current value supplied from the power semiconductor module 101 to the armature windings 31 and 41 of the motor generators 30 and 40, and a magnetic pole position of the rotors of the motor generators 30 and 40.

The target torque is based on an instruction signal outputted from a high level control unit. The current value is detected based on a detection signal outputted from a current transformer 194. The magnetic pole position is detected based on a detection signal outputted from rotating magnetic pole sensors 32 and 34 arranged in the motor generators 30 and 40. Although the foregoing description of the embodiment has been given of an example of detecting current values of two phases, a configuration of detecting current values of three phases may also be implemented.

The microcomputer calculates a target current of d and q axes based on the target torque, then calculates a target voltage of the d and q axes based on the difference between the calculated target current of the d and q axes and the detected current value of the d and q axes, and converts the calculated target voltage of the d and q axes to a target voltage of U-phase, V-phase, and W-phase based on the detected magnetic pole position. The microcomputer then generates a pulse modulation wave based on the comparison between a basic wave (sine wave) and a signal carrier (triangular wave) based on the target voltage of U-phase, V-phase, and W-phase. The microcomputer outputs the generated modulation wave to the drive circuit as a PWM (pulse width modulation) signal. Six PWM signals corresponding to the upper and lower arms of each phase are outputted from the microcomputer to the drive circuit. Other signals such as a rectangular signal may be used as a timing signal outputted from the microcomputer.

The drive circuit is constituted by a so-called IC (integrated circuit) in which a plurality of electronic circuit parts are integrated into one. The foregoing description of the embodiment has been given of an example where one IC is provided for each of the upper and lower arms of each phase (one in one). However, one IC may be provided in correspondence to each phase (two in one) or one IC may be provided in correspondence to all the arms (six in one).

When driving a lower arm, the drive circuit amplifies the PWM signal and outputs it, as a drive signal, to the gate electrode of the IGBT 111 of the corresponding lower arm. When driving an upper arm, the drive circuit shifts the level of the reference potential of the PWM signal to the level of the reference potential of the upper arm, then amplifies the PWM signal, and outputs it, as a drive signal, to the gate electrode of the IGBT 111 of the corresponding upper arm. Thus, each IGBT 111 performs a switching operation based on the inputted drive signal.

The control unit 103 conducts an abnormal detection (over current, over voltage, over temperature and so on), thereby protecting the power semiconductor module 101. For this reason, sensing information is inputted to the control unit 103. For example, from a sensor lead 163 of each arm, information of the current flowing through the emitter electrode of each IGBT 111 is inputted to the control unit 103. Consequently, the control unit 103 conducts an over current detection and terminates the switching operation of the corresponding IGBT 111 when an over current is detected, thereby protecting the corresponding IGBT 111 from the over current.

From a temperature sensor 104 arranged in the power semiconductor module 101, temperature information of the power semiconductor module 101 is inputted to the microcomputer. Information of the voltage of the DC positive electrode of the power semiconductor module 101 is inputted to the microcomputer. The microcomputer conducts an over temperature detection and over voltage detection based on these information and terminates switching operations of all the IGBTs 111 when an over temperature or over voltage is detected, thereby protecting the power semiconductor module 101 from the over temperature or over voltage.

(Configuration of Power Semiconductor Module)

Figure 10:
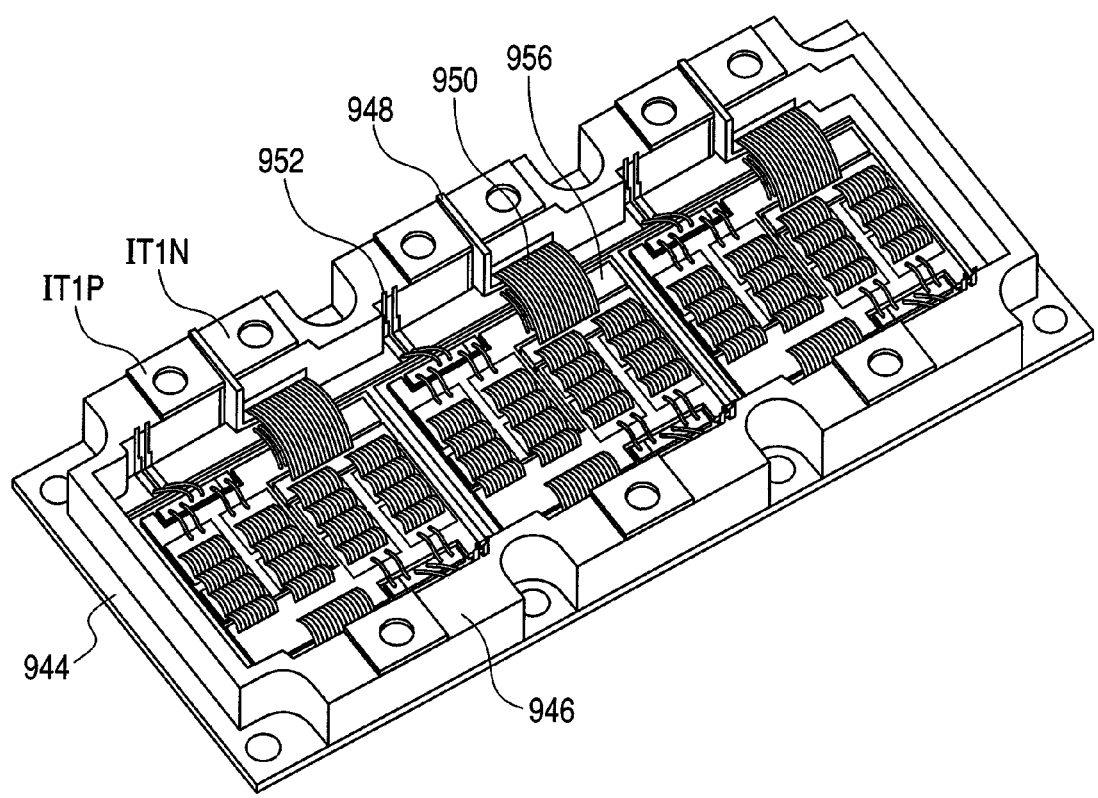
FIG. 10 is a schematic diagram of an exemplary power semiconductor module used in the power converter of the present invention.

FIG. 10 is a schematic diagram of an exemplary power semiconductor module 101 used in the power converter of this embodiment. The connection between a semiconductor chip (IGBT 111 and diode 112) and its terminal is included in the diagram.

In the power semiconductor module 101, a resin case 946 is mounted on one side of a metal base 944 made of copper and other materials. Inside the resin case 946, the metal base 944 is equipped with a plurality of IGBTs 111 and diodes 112.

The plurality of pairs of IGBTs 111 and diodes 112 are separated into U-phase, V-phase, and W-phase for performing PWM control. In FIG. 10, two pairs of IGBTs 111 and diodes 112 are provided in parallel connection for each arm. This is for allowing a large current to flow which is not possible with a single semiconductor chip alone. Additionally, for each phase, two pairs of IGBTs 111 and diodes 112 are mounted on the upper arm connected to the positive terminal that is a DC terminal and the lower arm connected to the negative terminal that is a DC terminal. Therefore, in the power semiconductor module 101 of FIG. 10, twelve pairs of IGBTs 111 and diodes 112 are provided in total.

A positive terminal IT1P and a negative terminal IT1N serving as DC terminals form a stack structure via an insulation sheet 948 inside the resin case. With this structure, the inductance of the DC wiring can be reduced.

These DC terminals are electrically connected to the IGBTs 111 or diodes 112 with a bonding wire 950. However, instead of the bonding wire 950, a metal plate may be used for the connection. The use of the metal plate allows a larger current to flow while maintaining the reliability, as compared to the case of using the bonding wire 950. The inductance of the wiring can also be reduced.

A gate pin 952 is also provided in the power semiconductor module for inputting a control signal from the gate substrate. The gate pin 952 is connected to a gate terminal of each IGBT 111.

The IGBTs 111 and the diodes 112 are mounted on an insulation substrate 956 made of nitride aluminum (AlN) or the like. Nitride aluminum (AlN) is preferably used because it has excellent thermal conductivity. Instead of nitride aluminum (AlN), nitride silicon (SiN) may be used. Nitride silicon (SiN) has enhanced toughness, and is therefore capable of forming a thin insulation substrate 956.

On the metal base 944 side of the insulation substrate 956, a full-scale pattern is formed of Ni-plated copper or the like, and on the chip (IGBT 111 and diode 112) side, a wiring pattern is formed of Ni-plated copper or the like. Application of metal onto both sides of the insulation substrate 956 allows soldering of the chip and metal base 944 and provides a sandwich structure in which the insulation substrate 956 is interposed between metals.

Such a structure prevents the deformation caused by the difference in thermal expansion coefficients when the temperature is changed. As a result of implementing this sandwich structure, when the insulation substrate 956 is made thin, eddy currents induced onto the full-scale pattern of the metal base 944 side increase in response to a change in current flowing through the wiring pattern of the chip 952 side during the switch operation. This can reduce the parasitic inductance of the wiring pattern on the insulation substrate 956, contributing to reducing the inductance in the power semiconductor module 101.

A silicone resin (not shown) is provided inside the resin case 946, and the IGBT 111, the diode 112, and the bonding wire 950 are covered with the silicone resin. Other resins may be used instead of the silicone resin. Covering a resin cover (not shown) thereover completes the power semiconductor module 101. On the resin cover, a gate substrate 201 to be described later will be mounted.

First Embodiment

Figure 3:
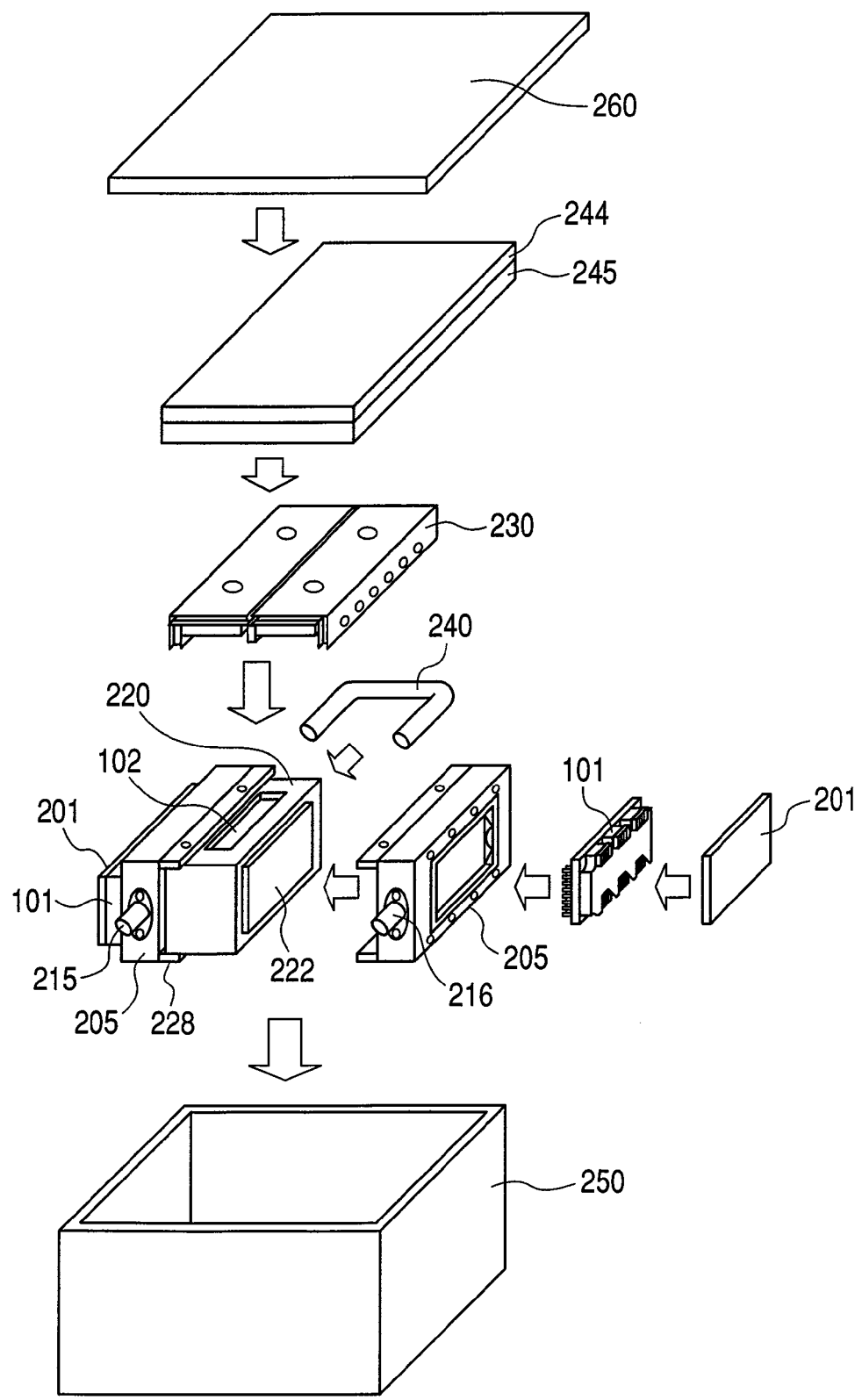
FIG. 3 is an exploded schematic diagram of the power converter of a first embodiment.
Figure 4:
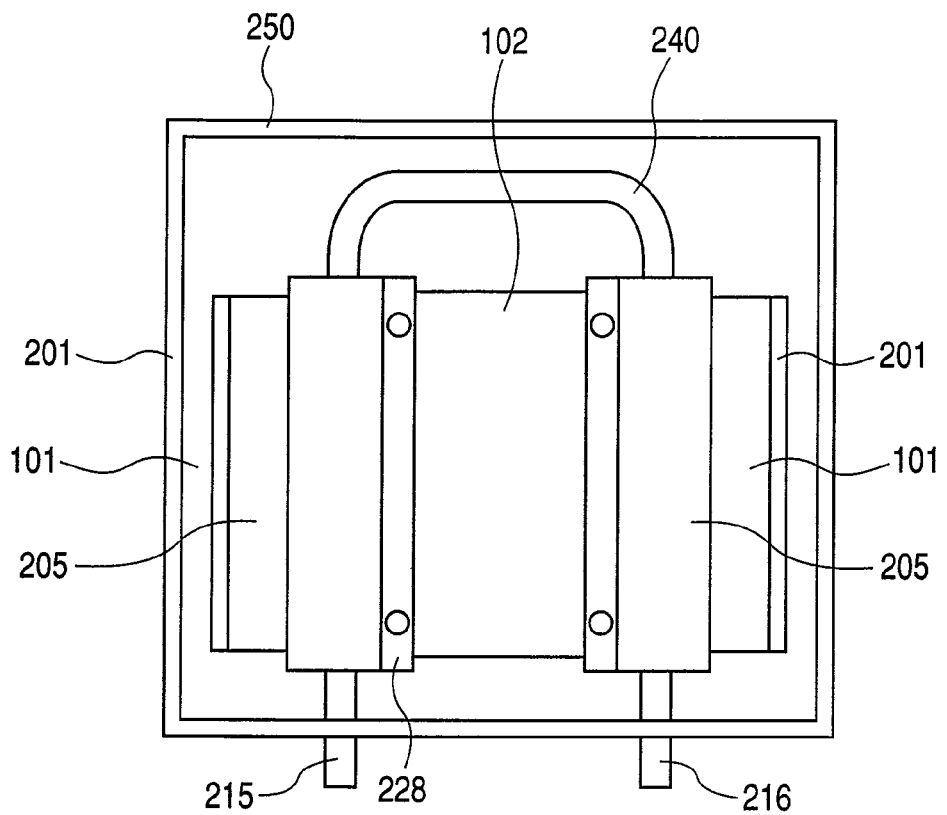
FIG. 4 is a cross-sectional view of the power converter of the first embodiment as seen from above.

FIG. 3 illustrates an exploded schematic diagram of the power converter of a first embodiment. FIG. 4 illustrates a cross-sectional view of the power converter of the first embodiment as seen from above.

The configuration of the power converter 100 in this embodiment will now be described.

The gate substrate 201 is provided with a drive circuit for controlling the drive of a switching device such as an IGBT and a MOSFET.

The power semiconductor module 101 includes a plurality of switching devices that are on/off controlled based on a control signal from the gate substrate 201. With such control, a DC voltage applied between the switching device of the upper arm and the switching device of the lower arm is converted to AC voltage of three phases; U-phase, V-phase, and W-phase.

A cooling jacket 205 includes a flow path of a coolant, such as water, for cooling the switching device that generates a lot of heat. One of the two cooling jackets 205 is provided with an inlet 215 serving as an entrance of the coolant from outside, and the other is provided with an outlet 216 serving as an exit to the outside.

The power converter 100 of this embodiment includes two gate substrates 201, two power semiconductor modules 101, and two cooling jackets 205. However, each of the quantities of the gate substrates 201, the power semiconductor modules 101, and the cooling jackets 205 is not limited to two but can be three or more as long as those components are multiple in quantity.

A plurality of capacitors are combined to constitute the capacitor module 102. The capacitor module 102 is provided with a metal case 220 in which the plurality of capacitors are arranged. A heat radiation sheet 222 is provided on the surface of the metal case 220 at the point in contact with the cooling jacket 205 to effectively release the heat generated by the capacitor module 102. In this embodiment, since two cooling jackets 205 are in contact with both sides of the metal case 220, heat radiation sheets 222 are provided on both sides of the metal case 220.

A DC bus bar 230 electrically connects the DC terminal (positive terminal and negative terminal) of the power semiconductor module 101 and the DC terminal (positive terminal and negative terminal) of the capacitor module 102. Implementation of a configuration where positive bus bars connected to the positive terminal and negative bus bars connected to the negative terminal are stacked via an insulator can reduce the inductance of the DC bus bar 230.

A connector 240 connects cooling paths of the two cooling jackets 205. The connection of the connector 240 to the two cooling jackets 205 completes the cooling path. The connector 240 is made of metal such as aluminum. Specifically, to prevent a vibration-oriented influence, a rigid material such as metal is preferably used. However, if priority is placed on easy attachment, a flexible material such as a rubber hose may also be used.

A control board 244 includes a control circuit for transferring a control signal to the gate substrate 201 based on an instruction from an external high level control unit. The control board 244 comprises a printed circuit board on which the control circuit is formed. To release heat generated from the control circuit, the control board 244 may include, as necessary, a cooling plate 245 made of metal such as aluminum. In this case, the printed circuit board has the control circuit mounted on the cooling plate 245, forming a dual structure.

A case 250 is made of metal such as aluminum and accommodates constituent elements, i.e., the gate substrate 201, the power semiconductor module 101, the cooling jackets 205, the connector 240, the DC bus bar 230, and the control board 244. A cover 260 is made of metal such as aluminum and is fixed to the case 250.

An assembly method of the power converter 100 in this embodiment will now be described.

The gate substrate 201 is first mounted on the power semiconductor module 101. In this case, a gate pin 952 of the power semiconductor module 101 is electrically connected to a control signal output of the gate substrate 201.

The power semiconductor module 101 having the gate substrate 201 mounted thereon is mounted on the cooling jackets 205. Although a path of a coolant is formed in the cooling jackets 205, the path is not complete before the power semiconductor module 101 is mounted. More specifically, the side where the power semiconductor module 101 is to be mounted is exposed to the outside. Thus, when the power semiconductor module 101 is mounted on the cooling jackets 205, the exposed parts are covered with the power semiconductor module 101, thereby completing the path. This embodiment takes a direct cooling structure employing the structure described above. However, the embodiment is not specifically limited to this, and a cooling jacket with a structure that independently completes the path may be used.

Figure 5:
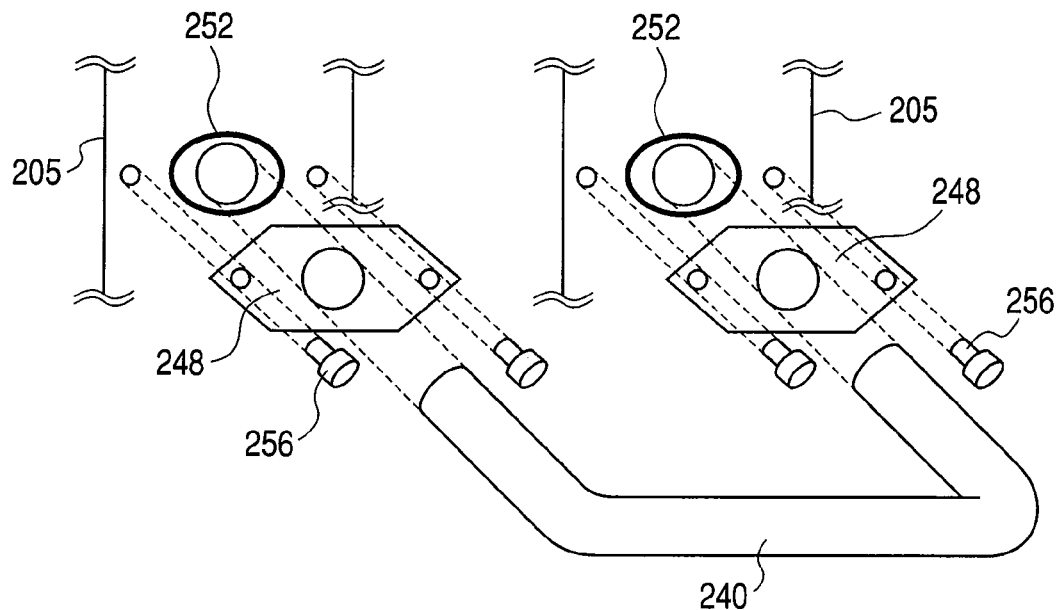
FIG. 5 is an enlarged exploded view of joints of a connector and cooling jackets.

The power semiconductor module 101 and the cooling jackets 205 are sealed by O-rings 252 (see FIG. 5). However, the sealing method is not limited to this, and sealing with a liquid seal material, welding, and so on is also possible.

The heat radiation sheets 222 are provided on both sides of the metal case 220 of the capacitor module 102. With these heat radiation sheets 222, the two cooling jackets 205 are brought into contact with both sides of the metal case 220. The cooling jackets 205 include props 228 and accommodate the capacitor module 102 being interposed between the upper and lower props 228. In this case, the cooling jackets 205 and the metal case 220 of the capacitor module 102 are fixed with a plurality of screws. However, the fixing method is not limited to this, and instead of the screws, welding and other methods may be used for fixing.

As a result, the two power semiconductor modules 101 are arranged such that the principal surfaces of the switching devices provided on the power semiconductor modules 101 are substantially parallel to each other. More specifically, vertically placing the two power semiconductor modules 101 and installing the cooling path for a coolant to flow and the capacitor module 102 therebetween allow miniaturization of the power converter 100.

The DC bus bar 230 is located on the upper part of the capacitor module 102. The DC bus bar 230 includes a positive bus bar and a negative bus bar, each of which electrically connects the DC terminal (positive terminal and negative terminal) of the capacitor module 102 and the DC terminal (positive terminal and negative terminal) of the power semiconductor module 101. Joints of these bus bars and terminals are fixed with screws. Alternatively, they may be fixed with other methods such as welding.

The connector 240 is then connected to the two cooling jackets 205. An enlarged exploded view of joints of the connector 240 and cooling jackets 205 is illustrated in FIG. 5.

The connector 240 includes flanges 248 at the tips where the connector 240 is connected to the cooling jackets 205. Between the connector 240 and the cooling jackets 205, the O-rings 252 are interposed. The flanges 248 are brought into contact with the cooling jackets 205 via the O-rings 252. The cooling jackets 205 are subsequently attached to the flanges 248 with screws 256 to securely fix the connector 240 and the cooling jackets 205. In FIG. 5, the connector 240 and the cooling jackets 205 are fixed with screws 256. However, alternatively, they may be fixed with welding and so forth.

The constituent elements thus assembled are then put inside the case 250. These constituent elements are fixed with screw clamps and so forth within the case 250.

Over the upper parts of the DC bus bar 230, the control board 244 is fixed inside the case 250. The control board 244 includes the cooling plate 245 for releasing the heat generated by the control circuit. The cooling plate 245 is placed on a platform 262 provided in the case 250. The cooling plate 245 and the platform 262 are fixed with screws and so forth.

Lastly, fixation of the cover 260 to the case 250 with screw clamps completes the power converter 100.

With the configuration described above, the present embodiment can improve the productivity while ensuring miniaturization of the power converter.

Second Embodiment

Figure 6:
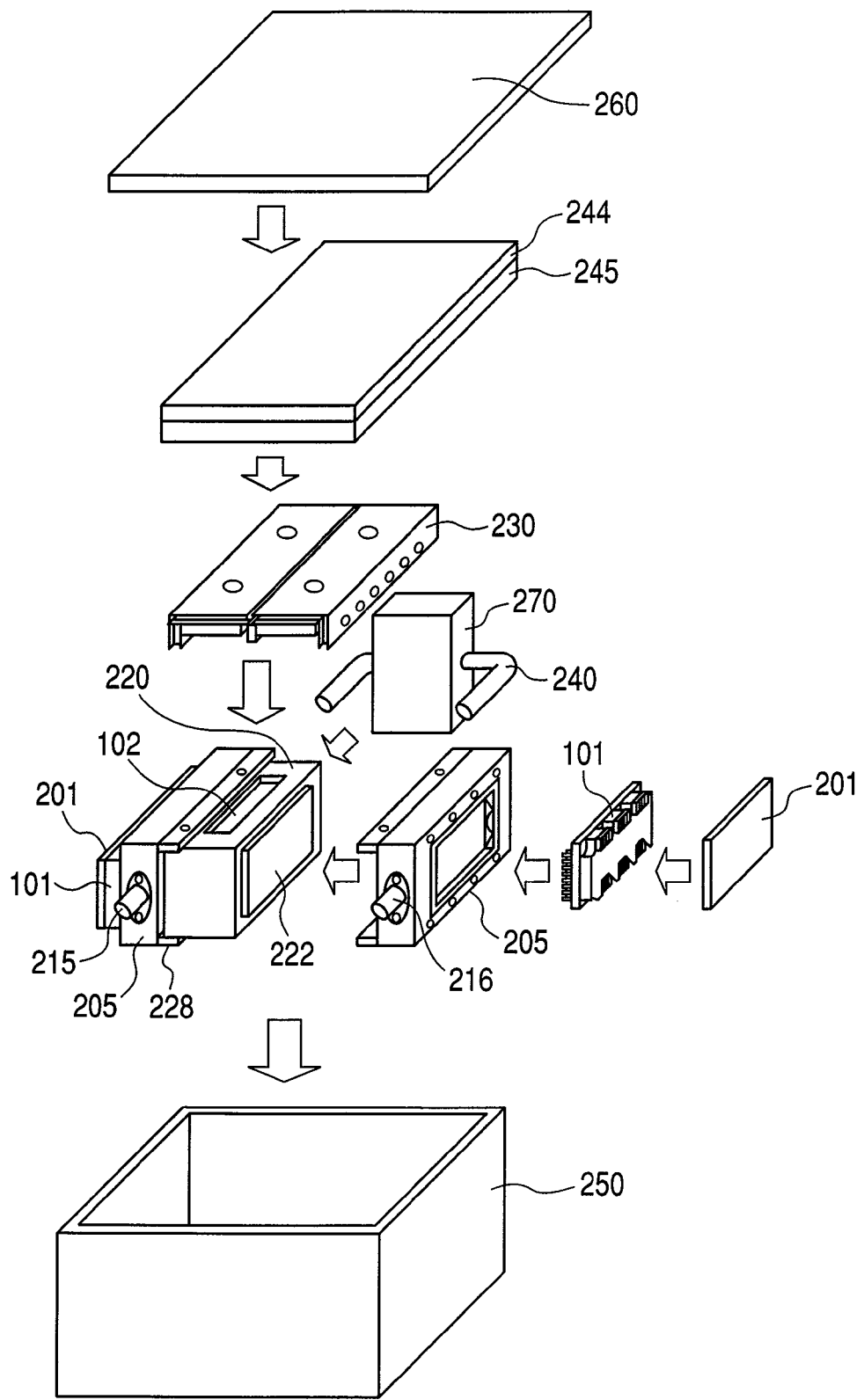
FIG. 6 is an exploded schematic diagram of the power converter of a second embodiment.

FIG. 6 illustrates an exploded schematic view of the power converter of a second embodiment.

As the basic configuration of this embodiment is identical to that of the first embodiment, descriptions of like elements will be omitted.

A power converter of this embodiment is provided with a DC-DC converter 270 in addition to the constituent elements included in the power converter of the first embodiment. The DC-DC converter 270 is designed to increase or decrease a predetermined DC voltage. As shown in FIG. 6, the connector 240 passes through the DC-DC converter 270, allowing effective cooling of heat generated by the DC-DC converter 270.

Because the DC-DC converter 270 also generates heat, when mounting the DC-DC converter 270 in the power converter 100, the heat radiation efficiency of the DC-DC converter 270 can be improved by bringing the DC-DC converter 270 into contact with the connector 240.

Figure 7:
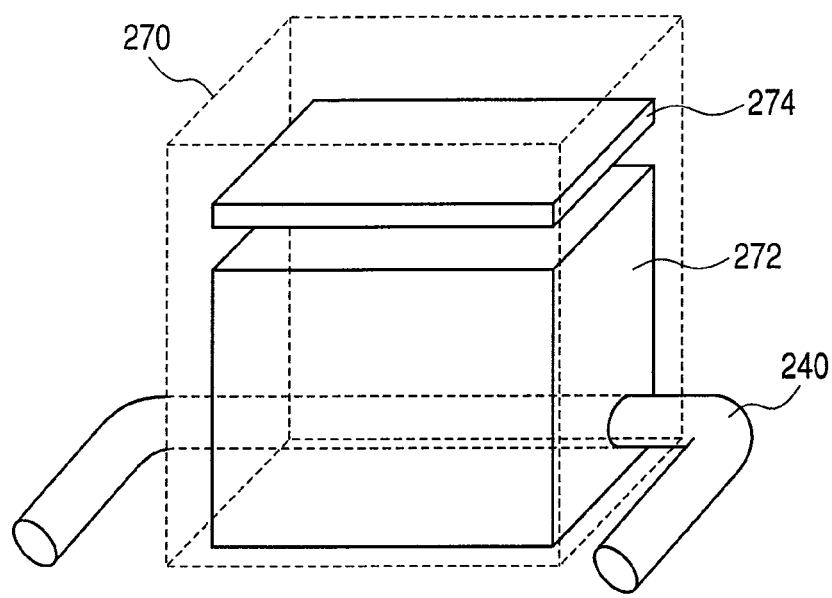
FIG. 7 is an enlarged schematic diagram of a DC-DC converter installed in the power converter of the present invention.

FIG. 7 illustrates an enlarged schematic diagram of the DC-DC converter 270.

The DC-DC converter 270 includes a reactor 272 and a control circuit board 274 equipped with a control circuit. The reactor 272 is resin-sealed. The resin that seals the reactor 272 covers part of the connector 240, forming an integrated configuration with the connector 240. Because the reactor 272 generates a lot of heat in the DC-DC converter 270, the integrated configuration covering the connector of the reactor 272 with seal resin allows efficient cooling in the connector 240 of the heat generated by the DC-DC converter 270.

In FIG. 7, the resin covers the connector 240, but the configuration is not limited to this. The DC-DC converter 270 may be directly fixed to the connector 240.

Third Embodiment

Figure 9:
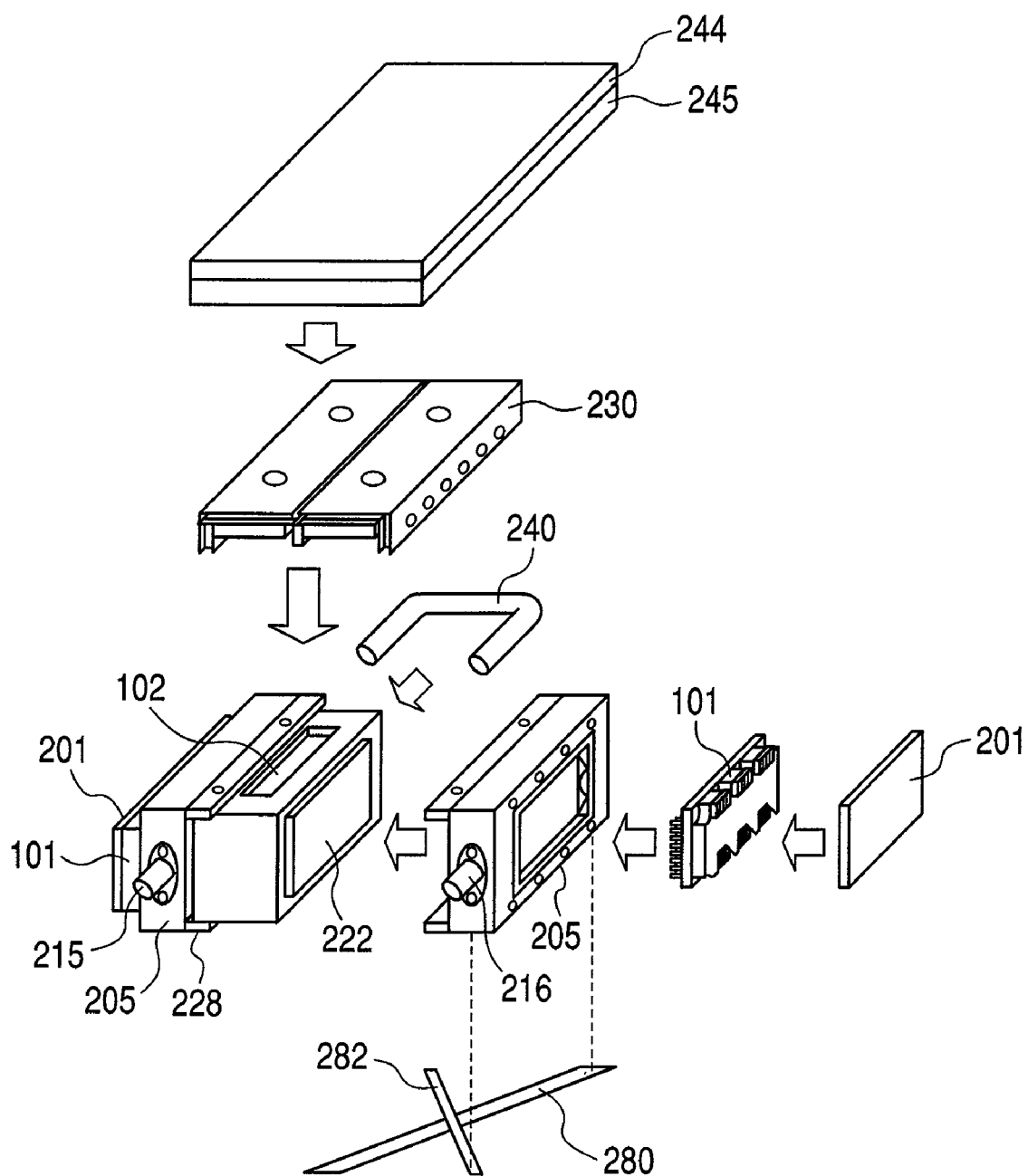
FIG. 9 is an exploded schematic diagram of the power converter of a third embodiment.

FIG. 9 illustrates an exploded schematic diagram of the power converter of a third embodiment.

As the basic configuration of this embodiment is identical to that of the first embodiment, descriptions of like elements will be omitted.

The power converter 100 of this embodiment includes a strut structure 280. The strut structure 280 is provided with two metal plates, which are fixed at a center portion 282. With the center portion as a reference point, the gap between the two metal plates can be altered.

In this embodiment, the strut structure 280 used as reinforcement is connected to the two cooling jackets 205. The use of such a strut structure 280 can realize strong fixation of each constituent element and thus improves resistance to vibration.

An assembly method of the power converter 100 of this embodiment is the same as that of the first embodiment up to the assembling of the gate substrate 201, power semiconductor module 101, cooling jackets 205, DC bus bar 230, and connector 240.

After mounting the constituent elements, the strut structure 280 is fixed to the two cooling jackets 205 with screw clamps and so forth. The subsequent procedures of putting them inside the case 250, mounting them on the control board 244 provided with the cooling plate 245, and fixing the cover 260 on the case 250 are the same as those of the first embodiment.

According to the power converter of this embodiment, miniaturization and improved productivity as well as improved vibration resistance can be achieved.

Fourth Embodiment

Figure 8:
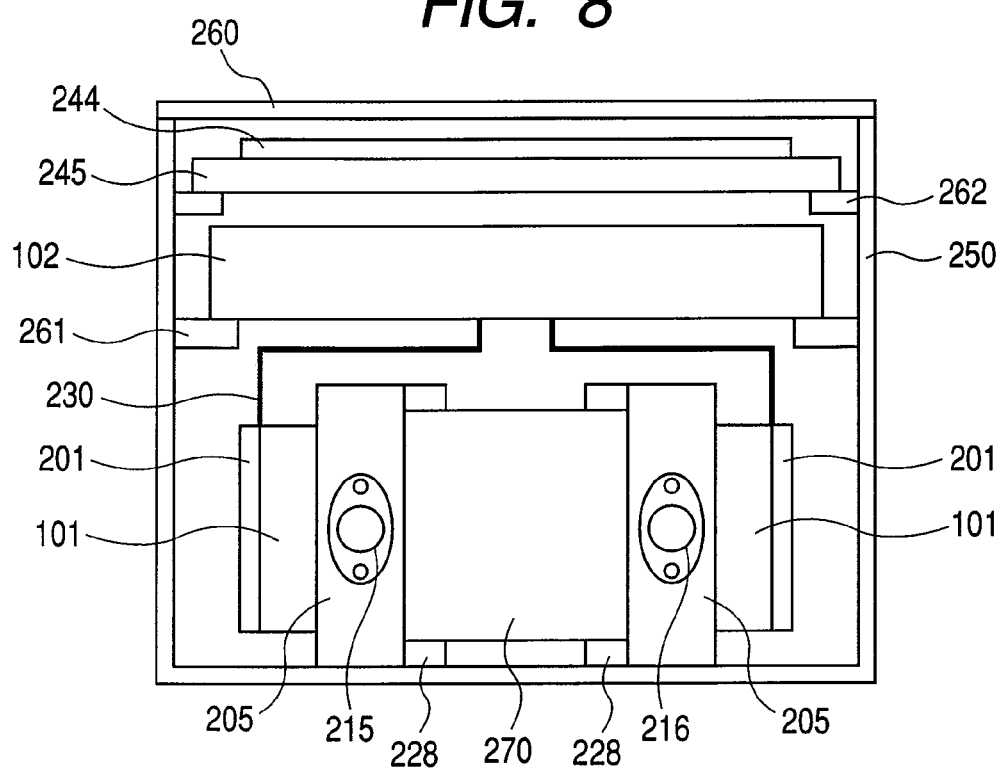
FIG. 8 is a cross-sectional view of the power converter of a fourth embodiment.

FIG. 8 illustrates a cross-sectional view of the power converter of a fourth embodiment. This figure visualizes the inside of the power converter 100 as seen from the side where the inlet 215 and outlet 216 of the coolant are located. Descriptions of like elements as in the above embodiments will be omitted, and only elements different from the above embodiments will be described.

In this embodiment, the DC-DC converter 270 is employed as an electronic part to be arranged between the two cooling jackets 205 instead of the capacitor module 102.

The DC-DC converter 270 supported by the props 228 is interposed between the two cooling jackets 205 at opposite sides of the DC-DC converter 270. With such a configuration, the DC-DC converter 270 can be more effectively cooled.

The capacitor module 102 is located on a platform 261 arranged in the case 250, above the cooling jackets 205 interposing the DC-DC converter 270. The DC bus bar 230 extending from the upper part of the power semiconductor module 101 extends upward where the capacitor module 102 is located and is electrically connected to the capacitor module 102.

Implementation of the configuration of this embodiment is preferable when prioritizing heat radiation efficiency of the DC-DC converter 270 over that of the capacitor module 102.

According to the power converter of this embodiment, miniaturization and improvement in productivity can be achieved while improving the flexibility in cooling the electronic parts.

The present invention has been described in detail with reference to the embodiments. However, the scope of the present invention is not limited to the embodiments, and appropriate modifications can be made without departing from the scope of the technical concept of the present invention.

For example, in the embodiments described, miniaturization of the power converter has been achieved by vertically placing the two power semiconductor modules. However, alternatively, the two power semiconductor modules may be arranged laterally, placing the two power semiconductor modules on the same plane.

In the embodiments described, the capacitor module or DC-DC converter is employed as the electronic part placed between the two cooling jackets. However, alternatively, other electronic parts may be placed between the two cooling jackets.

What is claimed is:

1. A power converter comprising:
   a first power semiconductor module including a first switching device;
   a second power semiconductor module including a second switching device;
   a cooling structure which includes a first cooling path, a second cooling path arranged substantially parallel to the first cooling path, and a connector which connects the first cooling path and the second cooling path;
   a capacitor module which filters DC electric power inputted into the first power semiconductor module and the second power semiconductor module;
   a DC bus bar for electrically connecting the capacitor module, the first power semiconductor module, and the second power semiconductor module; wherein;
   the capacitor module is disposed between the first cooling path and the second cooling path, and has a first contact surface with the first cooling path and a second contact surface with the second cooling path;
   the first power semiconductor module is fixed to the first cooling path, and the first switching device is installed so that a principal plane of the first switching device is substantially parallel to the first contact surface;
   the second power semiconductor module is fixed to the second cooling path, and the second switching device is installed so that a principal plane of the second switching device is substantially parallel to the second contact surface;
   the length of the first cooling path in a direction perpendicular to the first contact surface is shorter than its length in a height direction,
   the length of the second cooling path in a direction perpendicular to the second contact surface is shorter than its length in a height direction, and
   the DC bus bar electrically connects the first power semiconductor module, the second power semiconductor module, and the capacitor module, adjacent the first cooling path and the second cooling path.

2. The power converter according to claim 1, wherein the DC bus bar comprises a positive bus bar, a negative bus bar, and an insulator inserted between the positive bus bar and the negative bus bar.

3. The power converter according to claim 1, wherein each of the first cooling path and the second cooling path has an exposed part that is covered by the respective power semiconductor module with which it is in contact, thereby completing the cooling path into which the coolant flows.

4. The power converter according to claim 1, wherein:
   the capacitor module includes a plurality of capacitors; and
   positive and negative terminals of the plurality of capacitors are connected to positive and negative terminals of an external DC power supply, respectively.

5. The power converter according to claim 1, further comprising a control board having a control circuit mounted thereon for controlling the first switching device and the second switching device, the control board being placed on the DC bus bar.

6. The power converter according to claim 5, wherein the control board comprises a metal plate and a printed circuit board mounted thereon, with the control circuit being formed on the control board.

7. The power converter according to claim 6, further comprising a case to which the metal plate of the control board is connected, for releasing heat generated by the control circuit to the case.

8. The power converter according to claim 1, wherein the capacitor module is enclosed in a metal case which has a heat radiation sheet on the first contact surface.

* * * * *